United States Patent
Richter et al.

(10) Patent No.: US 9,887,345 B2
(45) Date of Patent: Feb. 6, 2018

(54) PIEZO-STACK WITH PASSIVATION, AND A METHOD FOR THE PASSIVATION OF A PIEZO-STACK

(71) Applicant: Continental Automotive GmbH, Hannover (DE)

(72) Inventors: Thomas Richter, Regensburg (DE); Harald Johannes Kastl, Fichtelberg (DE); Claus Zumstrull, Regenstauf (DE)

(73) Assignee: CONTINENTAL AUTOMOTIVE GMBH, Hanover (DE)

( * ) Notice: Subject to any disclaimer, the term of this patent is extended or adjusted under 35 U.S.C. 154(b) by 735 days.

(21) Appl. No.: 14/369,377

(22) PCT Filed: Dec. 19, 2012

(86) PCT No.: PCT/EP2012/076228
§ 371 (c)(1),
(2) Date: Jun. 27, 2014

(87) PCT Pub. No.: WO2013/098168
PCT Pub. Date: Jul. 4, 2013

(65) Prior Publication Data
US 2015/0035412 A1 Feb. 5, 2015

(30) Foreign Application Priority Data
Dec. 30, 2011 (DE) .......... 10 2011 090 156

(51) Int. Cl.
*H01L 41/083* (2006.01)
*H01L 41/053* (2006.01)
(Continued)

(52) U.S. Cl.
CPC .......... *H01L 41/083* (2013.01); *H01L 41/053* (2013.01); *H01L 41/0533* (2013.01);
(Continued)

(58) Field of Classification Search
CPC . H01L 41/053; H01L 41/083; H01L 41/0533; H01L 41/23; H01L 41/277; H01L 41/338
(Continued)

(56) References Cited

U.S. PATENT DOCUMENTS 6,236,146 B1    5/2001  Cramer et al. ............. 310/366
6,661,158 B2    12/2003  Kawazoe .................. 310/328
(Continued)

FOREIGN PATENT DOCUMENTS

DE    19646676 C1    4/1998    .......... H01L 41/047
DE    10021919 A1    8/2001    .......... H01L 41/083
(Continued)

OTHER PUBLICATIONS

International Search Report and Written Opinion, Application No. PCT/EP2012/076228, 18 pages, dated Apr. 15, 2013.

*Primary Examiner* — Thomas Dougherty
(74) *Attorney, Agent, or Firm* — Slayden Grubert Beard PLLC

(57) ABSTRACT

A piezo-stack includes a plurality of lateral surfaces and a first passivation layer applied to a first lateral surface. The first passivation layer terminates flush with opposing lateral surfaces that adjoin the first lateral surface.

10 Claims, 3 Drawing Sheets

(51) Int. Cl.
*H01L 41/22* (2013.01)
*H01L 41/23* (2013.01)
*H01L 41/338* (2013.01)
*H01L 41/277* (2013.01)

(52) U.S. Cl.
CPC ............ *H01L 41/23* (2013.01); *H01L 41/277* (2013.01); *H01L 41/338* (2013.01); *Y10T 29/42* (2015.01)

(58) Field of Classification Search
USPC .................. 310/340, 366, 346; 29/25.35
See application file for complete search history.

(56) References Cited

U.S. PATENT DOCUMENTS

| | | | | |
|---|---|---|---|---|
| 6,930,438 | B2 | 8/2005 | Cramer et al. ................. | 310/328 |
| 8,058,777 | B2* | 11/2011 | Goat ................... | H01L 41/0533 |
| | | | | 310/328 |
| 2003/0070271 | A1 | 4/2003 | Yasugi et al. ................. | 29/25.35 |
| 2007/0247025 | A1 | 10/2007 | Sciortino et al. ............. | 310/328 |
| 2008/0284283 | A1 | 11/2008 | Kaspar et al. ................. | 310/321 |
| 2010/0180865 | A1* | 7/2010 | Vendulet ............. | H01L 41/0533 |
| | | | | 123/472 |
| 2010/0264780 | A1* | 10/2010 | Kiefer ................... | H01L 41/083 |
| | | | | 310/340 |
| 2010/0325854 | A1* | 12/2010 | Reichinger ........... | H01L 41/257 |
| | | | | 29/25.35 |
| 2013/0328448 | A1* | 12/2013 | Gabl ................... | H01L 41/0533 |
| | | | | 310/340 |
| 2014/0015379 | A1* | 1/2014 | Galler ................ | H01L 41/0533 |
| | | | | 310/366 |
| 2014/0026858 | A1 | 1/2014 | Okamura et al. ............. | 123/456 |

FOREIGN PATENT DOCUMENTS

| | | | | |
|---|---|---|---|---|
| DE | 10163005 A1 | 10/2002 | ............. | F02M 51/00 |
| DE | 102006002695 A1 | 8/2007 | ............ | H01L 23/28 |
| DE | 102006025172 B4 | 12/2007 | ............. | F02M 51/06 |
| DE | 102010055004 A1 * | 6/2012 | ........... | H01L 41/053 |
| EP | 0167392 B1 | 5/1992 | ........... | H01L 41/083 |
| JP | 4273485 A | 9/1992 | ........... | H01L 41/083 |
| JP | 2009267114 A | 11/2009 | ........... | H01L 41/083 |
| WO | 02/089225 A2 | 11/2002 | ............. | H01L 41/04 |
| WO | 2012/099233 A1 | 7/2012 | ............. | F02M 51/00 |
| WO | 2013/017592 A1 | 2/2013 | ........... | H01L 41/053 |
| WO | 2013/098168 A1 | 7/2013 | ........... | H01L 41/053 |

\* cited by examiner

US 9,887,345 B2

PIEZO-STACK WITH PASSIVATION, AND A METHOD FOR THE PASSIVATION OF A PIEZO-STACK

CROSS-REFERENCE TO RELATED APPLICATIONS

This application is a U.S. National Stage Application of International Application No. PCT/EP2012/076228 filed Dec. 19, 2012, which designates the United States of America, and claims priority to DE Application No. 10 2011 090 156.6 filed Dec. 30, 2011, the contents of which are hereby incorporated by reference in their entirety.

TECHNICAL FIELD

The present invention relates to a piezo stack with passivation and to a method for the passivation of a piezo stack.

BACKGROUND

Piezoelectric components may, for example in the form of piezo actuators, be formed as multilayer components with a number of respectively alternately arranged piezoelectric ceramic layers and electrode layers, and are gaining ever more importance in modern electrical engineering. For example, piezo actuators are used as adjustment drives in connection with valves and the like. Piezo actuators are also used for injecting fuel into a combustion space. Here, the requirements are increasing according to the increased requirements in terms of emission and consumption. Higher pressures and temperatures, as well as multiple injections, are requiring a higher thermal stability of the actuator as well as a high durability.

A known piezo actuator is described, for example, in DE 196 46 676 C1. In the case of the piezo ceramics used, use is made of the effect that they become charged under mechanical pressure, or tension, and on the other hand they expand when an electrical voltage is applied along the principal axis of the ceramic layer. In order to multiply the usable length expansion, for example, monolithic multilayer actuators are used, which comprise or consist of a sintered stack of thin films of piezo ceramic (for example lead zirconate titanate) with incorporated metal electrode layers. The electrode layers are alternately fed out of the stack and are electrically connected in parallel by means of external metallizations. To this end, a continuous strip-shaped or band-shaped external metallization, which is connected to all the electrode layers with the same polarity, is respectively applied on the two contact sides of the stack.

If an electrical voltage is applied to the external contact, the piezo films expand in the field direction. Owing to the mechanical series connection of the individual piezo films, the rated expansion of the entire stack is already achieved with relatively low electrical voltages.

In order to achieve an optimal excursion of the multilayer piezo-ceramic actuator together with minimal space requirement, it is favorable for the electrode layers to comprise the entire cross section of the actuator. This type of actuator is also known by the term fully active piezo stack. This means that electrode layers of alternating polarity are exposed on the lateral surfaces of the multilayer ceramic.

For this reason, it is necessary to provide these exposed electrode layers with suitable passivation. Passivation generally involves a nonmetallic protective layer, insulation layer or the like, by means of which electrical arcing and short circuits between neighboring electrode layers can be avoided. Without passivation, such arcing and short circuits could be caused, for example, by mechanical damage to the surface or contamination with impurities (for example grinding dust, fingerprints, and the like), moisture or fuels (for example diesel, rape methyl ester, and the like). Such damage and/or contamination may occur particularly during operation of the actuator, but also during the production process.

One possibility for this insulating layer is to apply a coating layer, which may comprise polyimide as material. The family of polyimides have been found most suitable for this use owing to their properties in respect of glass transition temperature, thermal stability and insulation properties. In the case of passivation with polyimide coating, however, during the application and curing process, layer thickness inhomogeneities and sometimes insufficient coverage at the edges (edge thinning) may occur. As a consequence, electrical voltage arcing can occur during operation.

One conventional approach is to carry out passivation of a piezo stack on all sides, each of the four sides being coated and cured separately. Piezo stacks on which there are poorly covered edges are subsequently rejected.

The passivation of piezo stacks on all four sides is very elaborate. This outlay is additionally increased by the material waste due to defective piezo stacks.

From WO 2002/089225, it is known to provide a passivation material for a piezoelectric component in multilayer design, which has a tear strength that is less than the adhesion strength of the passivation material on the electrical component. In this case, inter alia, plastics, polyurethanes, resins or polyimides are provided. From US 2007 024 7025 A1, it is also known to use glass as a passivation material.

SUMMARY

A piezo stack comprises a plurality of side surfaces, and a first passivation layer, which is applied on a first side surface, wherein the first passivation layer essentially forms a rectangle in cross section and ends flush with the side surfaces of the piezo stack which adjoin the first side surface of the piezo stack.

In a further embodiment, the piezo stack comprises a second passivation layer applied on a second side surface, wherein the second side surface is arranged opposite the first side surface, and wherein the second passivation layer essentially forms a rectangle in cross section and ends flush with the side surfaces of the piezo stack which adjoin the second side surface of the piezo stack.

In a further embodiment, the first and/or second passivation layer comprises plastic.

In a further embodiment, the plastic comprises a polyimide.

In a further embodiment, the piezo stack comprises a third and/or a fourth passivation layer, which is applied on a third and/or fourth side surface of the piezo stack, wherein the third and/or fourth passivation layer extends in its extent perpendicular to the stack direction beyond the width of the third and/or fourth side surface of the piezo stack and the thickness of the first and second passivation layers.

Another embodiment provides a method for the passivation of at least one side surface, with a first length, of a piezo stack, comprising the following method steps: providing a piezo block having side surfaces with a second length, the second length being greater than the first length, applying a first passivation layer on at least one first side surface of the piezo block, curing the first passivation layer, and mechanically separating the piezo block so that at least one piezo stack with the first length is obtained.

In a further embodiment, a second passivation layer is applied on a second side surface of the piezo block, which is arranged on an opposite side to the at least first side surface, before the mechanical separation.

In a further embodiment, the application of the first and/or second passivation layer is carried out by dispensing, template printing or screen printing.

In a further embodiment, the second passivation layer is cured before the mechanical separation of the piezo block.

In a further embodiment, the mechanical separation of the piezo block is carried out along one or more separating axes, which respectively extend perpendicularly to the first and second side surfaces.

In a further embodiment, the method includes the following additional method steps: applying a third and/or fourth passivation layer onto a third and/or fourth side surface of the at least one piezo stack, and wherein the third and/or fourth passivation layer extends in its extent perpendicular to the stack direction beyond the width of the third and/or fourth side surface of the piezo stack and the thickness of the first and second passivation layers.

BRIEF DESCRIPTION OF THE DRAWINGS

Example embodiments are explained below with reference to the appended figures, in which.

DETAILED DESCRIPTION

Figure 1:
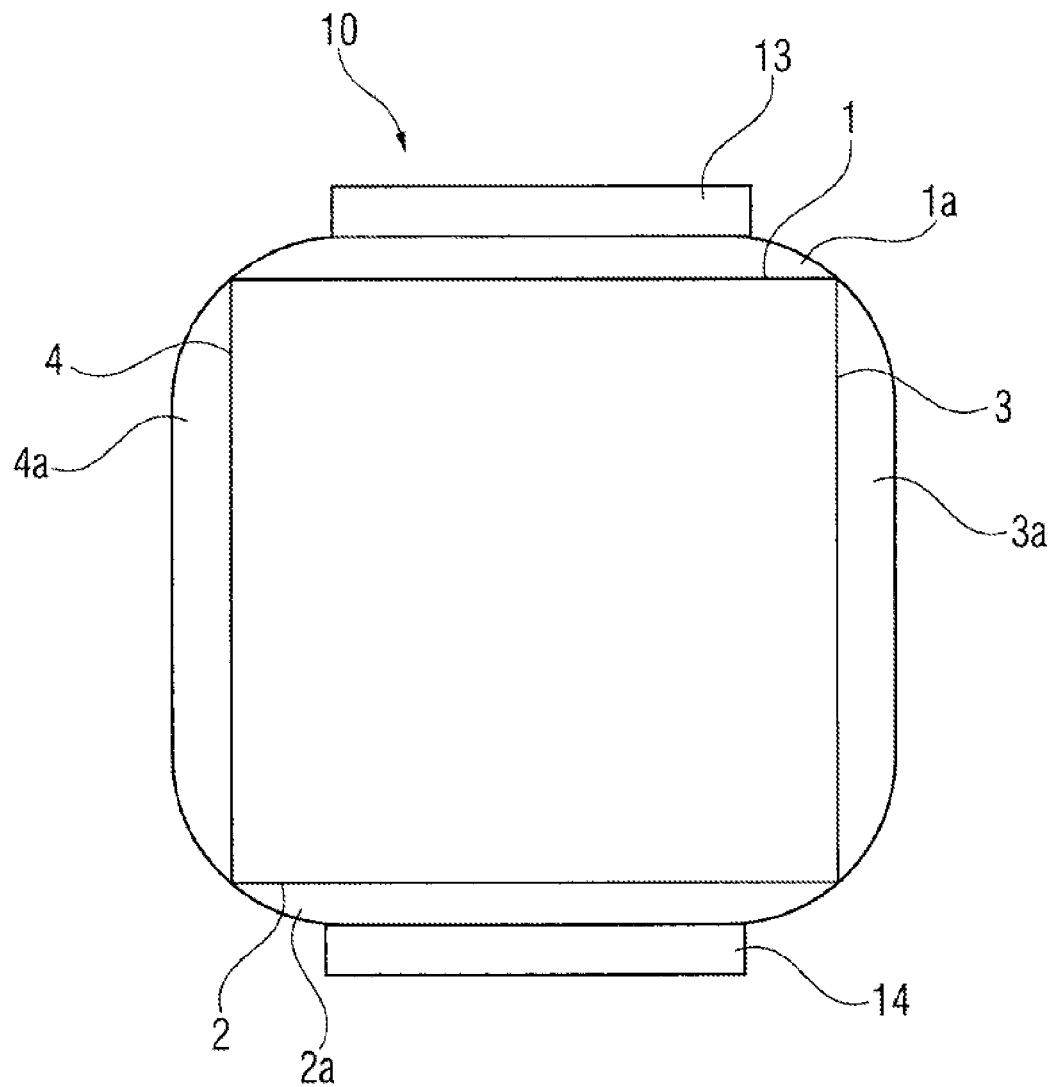
FIG. 1 shows a piezo stack according to the prior art with passivation on four sides.

Embodiments of the present invention provide a piezo stack having an improved passivation, as well as a method for passivation of the piezo stack.

In some embodiments, the piezo stack comprises
a plurality of side surfaces,
a first passivation layer, which is applied on a first side surface, and
the first passivation layer forming a rectangle in cross section and ends flush with the side surfaces of the piezo stack which adjoin the first side surface of the piezo stack.

The piezo stack may be a fully active stack. The piezo stack may be cuboid, and may be delimited by two rectangular surfaces perpendicular to the stack direction (axial direction) as well as by four rectangular side surfaces which extend parallel to the axial direction. The side surfaces respectively have a length and width (perpendicular to the axis), and a height (in the axial direction).

According to some embodiments, a first side surface of the piezo stack has a passivation layer, the cross section of which in section perpendicular to the axis is essentially rectangular. The passivation layer in this case advantageously extends over the entire length, and width, of the first side surface with a uniform layer thickness. This means that no edge thinning occurs at the edges. Preferably, the passivation layer has a uniform layer thickness over the entire first side surface. The surface of the passivation layer is therefore plane-parallel to the first side surface of the piezo stack. Electrical arcing between neighboring electrodes can thereby be avoided in the edge region of the piezo stack.

In one embodiment, the piezo stack comprises
a second passivation layer, which is applied on a second side surface,
the second side surface is arranged opposite the first side surface, and
the second passivation layer forming a rectangle in cross section and ending flush with the side surfaces of the piezo stack which adjoin the second side surface of the piezo stack.

The second passivation layer may be formed similarly as the first passivation layer, and may in particular have all the features described above for the first passivation layer. A second passivation layer which likewise ends flush with the side surfaces of the piezo stack has the advantage that the piezo stack can be electrically contacted reliably from two opposite sides. The possibility of opposite contacting is advantageous for the application of a desired voltage to ceramics that are to expand.

The contacting of the piezo stack may be carried out via the first and/or second passivation layer. For reliable contacting of the inner electrodes of the preferably fully active piezo stack, the first and/or second passivation layer is for example structured by forming trenches so that every second inner electrode is exposed through a trench. Contacting of the exposed inner electrodes with an outer electrode may then be carried out in the trenches, for example with a conductive adhesive.

In one configuration, the first and/or second passivation layer comprises plastic. Plastic is an electrically insulating material, and this ensures that no voltage arcing occurs between neighboring electrodes during operation of the piezo stack. Particularly preferably, the first and/or second passivation layer comprises a polyimide. This is suitable in particular for structuring to form the trenches, for example with the aid of a laser.

According to one embodiment, the piezo stack also comprises a third and/or fourth passivation layer on the third and/or fourth side surfaces. These may be formed from the same material as the first and second passivation layers. They may, however, also comprise a different material, for example ceramic, glass or a thermally stable silicone.

The third and/or fourth passivation layer may be applied after the first and/or second passivation layer, so that they also extend beyond the thickness of the first and second passivation layers in their extent perpendicular to the stack direction of the piezo stack. These third and fourth passivation layers may respectively have edge thinning toward their edges adjoining the first and second passivation layers, i.e. their layer thicknesses may decrease toward these edges without the function of the disclosed piezo stack being compromised. If the third and fourth passivation layers also extend beyond the piezo stack over the thickness of the first and second passivation layers, the layer thickness over the edges of the piezo stack is sufficiently large to prevent voltage arcing and short circuits even in the event of edge thinning.

In some embodiments, a method for the passivation of at least one side surface, with a first length, of a piezo stack comprises the following method steps:
providing a piezo block having side surfaces with a second length, the second length (L2) being greater than the first length, applying a first passivation layer on at least one first side surface of the piezo block with the second length,
curing the first passivation layer, and
mechanically separating the piezo block so that at least one piezo stack with the first length is obtained.

The piezo block comprises or consists of an arrangement of alternately stacked piezo-ceramic layers and electrode layers. The piezo block has a height in the stack direction and a width and a second length perpendicular to the stack direction. The second length is greater than the first length, preferably greater than a multiple of the first length of the piezo stack to be obtained. The electrode layers are preferably formed continuously, so that at least one fully active piezo stack is obtained with the method.

On a first side surface of the piezo block with the second length, a first passivation layer is applied. The first passivation layer is preferably thin. It is subsequently cured.

After the curing, the piezo block is mechanically separated into one or more individual piezo stacks with the first length, the edge regions preferably being discarded.

When the first passivation layer is applied, edge thinning may occur toward the ends of the piezo block owing to surface tension. Yet since the ends of the piezo block, i.e. the edge regions, at which the thickness of the coating decreases owing to the edge thinning, are preferably separated and discarded, this ensures that there is full passivation, without edge thinning, in the edge region of each individual piezo stack.

The passivation layer of the individual piezo stack with the first length therefore forms a rectangle in cross section perpendicular to the stack direction, and has a uniform layer thickness. The layer thickness of the passivation layer is preferably constant over the entire side surface of the first length of the individual piezo stack. Owing to the mechanical separation of the piezo block into one or more individual piezo stacks with the first length, the likewise separated passivation layer furthermore ends flush with the adjoining side surfaces of the individual piezo stack at the separation edges after the first passivation layer has been applied. In this way, electrical arcing is avoided during operation of the piezo stack, i.e. when a voltage is applied to the electrodes.

In one configuration of the method, a second passivation layer is applied on a second side surface of the piezo block before the mechanical separation. This second side surface is arranged on an opposite side to the at least first side surface, and likewise has the second length. This leads to a piezo block having a first and second passivation layer, which are arranged on opposite side surfaces. The subsequent electrical contacting of the individual piezo stacks is also carried out on these two side surfaces having the passivation layers.

Owing to the production of piezo blocks with two opposite passivation layers on the electrode sides, it is possible to separate individual piezo stacks which can be contacted directly. This reduces the number of the process steps comparison with the passivation of four side surfaces. It furthermore avoids reduced edge wetting of the passivation (edge thinning) occurring on the edges of the two side surfaces of the individual piezo stacks, which may lead to reduced electrical insulation of the electrode. Furthermore, it is possible to avoid layer thickness inhomogeneities of the passivation which may occur during the passivation of individual piezo stacks, since the passivation may be deposited more strongly toward the middle of the surface than at the edges.

In another embodiment, the application of the first and/or second passivation layer is carried out by dispensing, template printing or screen printing. These are conventional methods for the passivation of surfaces, have effective outcomes and ensure reliable results.

In another embodiment, the second passivation layer is cured before the mechanical separation of the piezo block. Curing the second passivation layer on the piezo block has the advantage that the curing only needs to be carried out once. If the curing was carried out after the mechanical separation, the curing would have to be carried out individually on each piezo stack. Here again, process steps are saved.

In another embodiment, the mechanical separation of the piezo block is carried out along separating axes, which respectively extend perpendicularly to the first and second side surfaces. The effect achieved by this is that the surfaces of the piezo stack are arranged at a right angle to one another. The surface on which the piezo stack is separated is therefore oriented parallel to the excursion direction during operation. This in turn makes it possible for the excursion of the piezo stack to be distributed uniformly over the surface.

According to another embodiment, a third and/or fourth passivation layer is applied on the cut edges, resulting from the separation, of the individual piezo stacks. These may, for example, be applied by conventional passivation methods such as the methods mentioned above. In this case, the third and/or fourth passivation layer is preferably applied not only over the entire width of the individual piezo stack, but also beyond the thickness of the first and/or second passivation layer, i.e. over the entire cut edge resulting from the separation. In this case, the third and/or fourth passivation layer may have a layer thickness decreasing toward the edges adjoining the first and/or second passivation layer (edge thinning), without the functionality of the piezo stack being compromised.

FIG. 1 shows a piezo stack 10 according to the prior art in plan view with a plurality of side surfaces 1, 2, 3, 4; a first 1, second 2, third 3 and fourth 4 side surface, which usually enclose a square or rectangle. The plurality of side surfaces 1, 2, 3, 4 respectively have a passivation layer 1a, 2a, 3a, 4a, which may comprise plastic. The piezo stack 10 furthermore comprises of electrical contacts 13, 14, which are formed on two opposite side surfaces 1, 2. In the case of passivation with plastic, for example polyimide or polyimide coating, layer thickness inhomogeneities may occur during the application and curing process, and sometimes insufficient coverage at the edges with the passivation. This can be seen in FIG. 1 on the incompletely passivated corners. During operation, this can lead to electrical arcing since these regions are not sufficiently passivated and therefore insulated.

Figure 2:
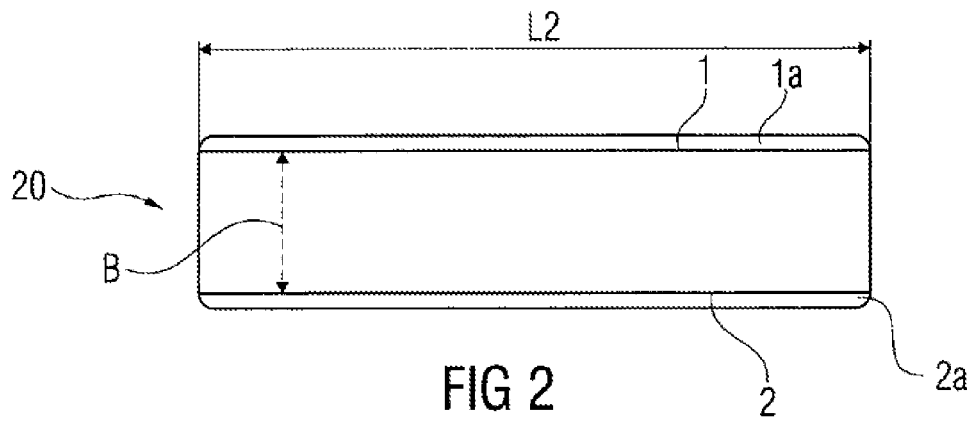
FIG. 2 shows a piezo block with passivation on two sides.

FIG. 2 shows a piezo block 20 in side view. The piezo block 20 has a second length L2 and a width B. The piezo block 20 has side surfaces 1, 2 with the length L2. In FIG. 2, the first 1 and second 2 side surfaces are shown in a sectional representation. A passivation layer 1a, 2a is respectively applied on these side surfaces 1, 2. The passivation layer comprises, for example, plastic. A suitable plastic is preferably thermally stable, has good adhesion to ceramic and electrically insulates.

Polyimide or polyimide coating is preferably used as the plastic.

A first passivation layer 1a is first applied on the first side surface 1 of the piezo block 20. This first passivation layer 1a is subsequently cured. A second passivation layer 2a is subsequently applied on a second side surface 2 of the piezo block, which is arranged opposite the first side surface 1. This second passivation layer 2a is likewise cured. It is, however, also possible for the first and second passivation layers 1a, 2a to be applied simultaneously and subsequently cured simultaneously. This would save on additional process steps.

Furthermore, it is conceivable for the first and second passivation layers 1a, 2a to be applied successively but subsequently cured simultaneously. This procedure would also save on at least one process step.

The application of thin layers that lead to passivation layers may be carried out by conventional methods such as dispensing, template printing or screen printing. The first and/or second passivation layer 1a, 2a may comprise plastic such as polyimide or polyimide coating. The first and second passivation layers 1a, 2a may also comprise different materials.

Figure 3:
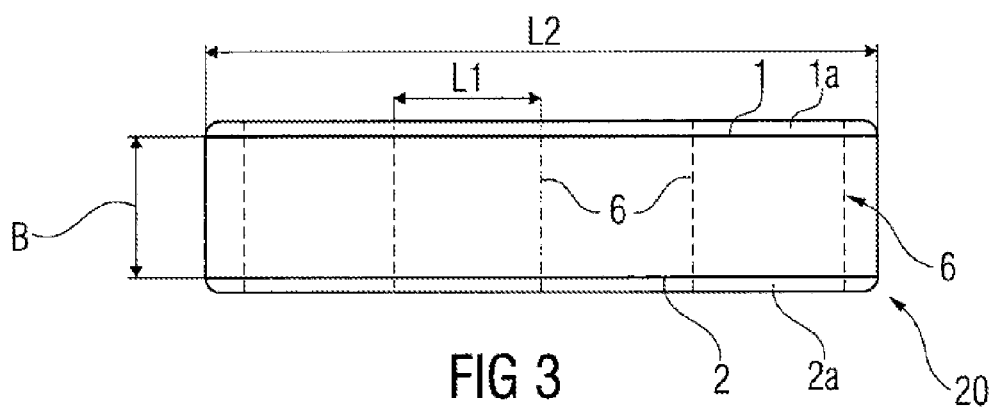
FIG. 3 shows a piezo block with passivation on two sides and separation axes.

FIG. 3 represents a piezo block 20 as in FIG. 2. In addition, separation axes 6, on which the mechanical separation of the piezo block 20 into piezo stacks 10 is carried out, are also marked in FIG. 3. The piezo stacks 10 resulting from the mechanical separation correspondingly each have first length L1. The separation axes 6 extend perpendicularly to the second length L2. The side surfaces 3, 4, resulting from the separation at the cut edges, of the individual piezo stacks 10 each have the width B.

Figure 4:
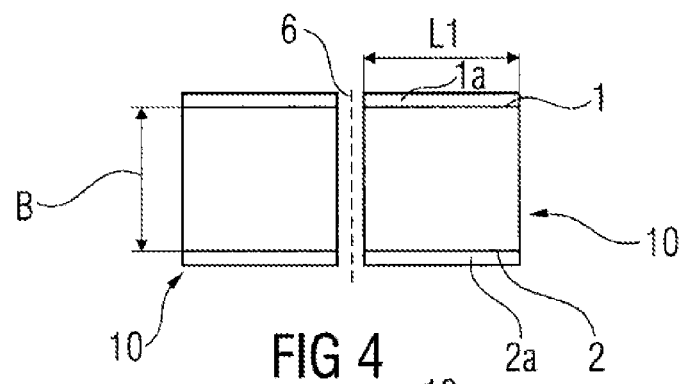
FIG. 4 shows a piezo stack according to an example embodiment with passivation on two sides.

FIG. 4 represents two piezo stacks 10, through which a separation axis 6 symbolically extends. The piezo stack 10 has a first side surface 1 with a first passivation layer 1a. The piezo stack 10 furthermore has a second side surface 2, which is arranged opposite the first side surface 1. A second passivation layer 2a is applied on the second side surface 2. Perpendicularly to the first side surface 1 and the second side surface 2, a third side surface 3 with the width B, on which ceramic may for example be applied, is represented. The mechanical separation of the piezo block 20 along the separation axis 6 ensures that the first passivation layer 1a and the second passivation layer 2a have only small layer thickness inhomogeneities, so that the passivation layers 1a, 2a respectively form a rectangle in cross section. This applies particularly to the edge region, where edge thinning usually occurs when applying the passivation layer, as represented in FIG. 1. This edge thinning, with which the thickness of the passivation layers 1a, 2a in the edge region is reduced, can thus be avoided on the individual piezo stacks since their edge regions are not formed until after the passivation, or after the mechanical separation.

Figure 5:
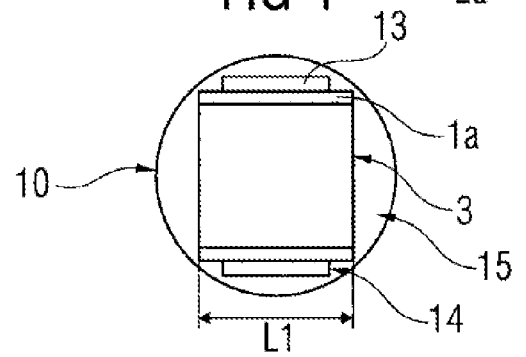
FIG. 5 shows a piezo stack with passivation on two sides and electrical contacting.

FIG. 5 represents a piezo stack 10 as in FIG. 4. In addition, a first contact 13 and a second contact 14 are represented on the piezo stack 10. The first contact 13 is applied on the first passivation layer 1a, and the second electrical contact 14 is applied on the second passivation layer 2a. Furthermore, the piezo stack 10 is embedded in encapsulation 15, which ensures passivation of those surfaces which are not contacted.

The processing of piezo blocks 20 makes it possible to apply passivation layers over the entire length L2 of the piezo block 20, which on the piezo stacks subsequently separated therefrom extend very uniformly on the side surface and the edge of the stack. Furthermore, the number of process steps required (coating of each individual side surface 1, 2, 3, 4) is reduced.

Figure 6:
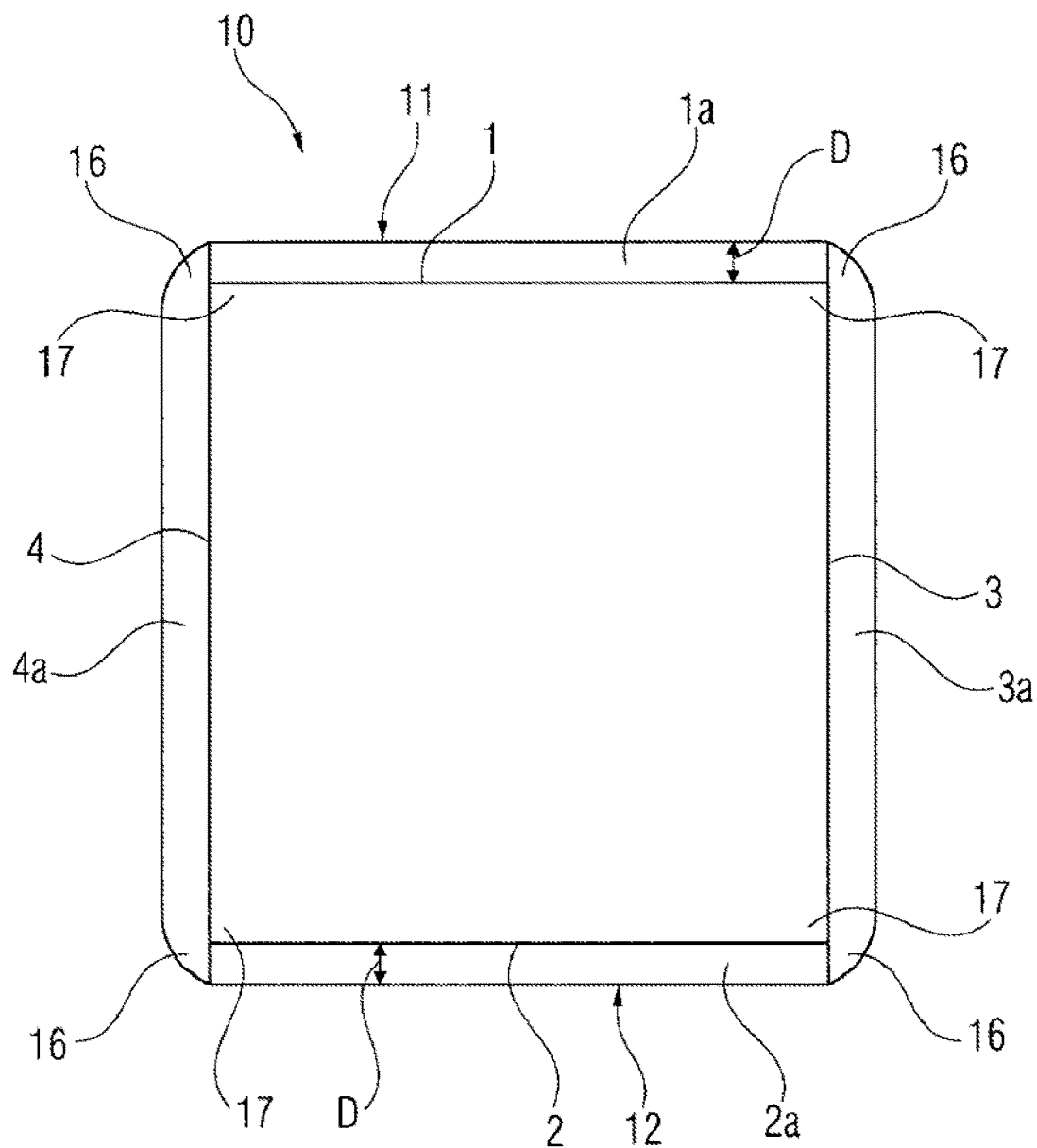
FIG. 6 shows in sectional view a piezo stack according to another embodiment with passivation on four sides.

FIG. 6 shows in sectional view a piezo stack according to an example embodiment with passivation on four sides. The piezo stack has four side surfaces 1, 2, 3 and 4. On the first side surface 1 and the opposite side surface 2, the piezo stack has a first and second passivation layer 1a, 2a with a rectangular cross section. The first and second passivation layers 1a, 2a end flush with the third and fourth side surfaces 3, 4 of the piezo stack 10. The surfaces 11 and 12 of the first and second passivation layers are formed parallel to the first and second side surfaces of the piezo stack 1 and 2. On the third and fourth side surfaces 3, 4 of the piezo stack 10, the latter is provided with a third and fourth passivation layer 3a, 4a. These extend not only over the width B of the side surfaces 3 and 4 of the piezo stack, but also beyond the thickness of the first and second passivation layers 1a, 2a. Toward the edges, the third and fourth passivation layers 3a, 4a have a decreasing layer thickness 16 (edge thinning). This, however, does not compromise the function of the disclosed piezo stack since there is a sufficient layer thickness for the passivation at the corners 17 of the piezo stack.

Piezo stacks 10 with passivation on two sides, and the method for the passivation of piezo blocks on two sides and the subsequent mechanical separation into individual piezo stacks, may particularly advantageously be used for piezo stacks for diesel injectors for motor vehicles.

The invention claimed is:

1. A piezo stack, comprising:
a plurality of side surfaces including opposing first and second side surfaces and opposing third and fourth side surfaces perpendicular to the first and second side surfaces, and
a first passivation layer applied on the first side surface, wherein the first passivation layer has a rectangular cross section defining a pair of opposing ends that are flush with the opposing third and fourth side surfaces of the piezo stack, and the first passivation layer has a depth measured perpendicular to the first side surface,
a third passivation layer applied on the third side surface of the piezo stack perpendicular to the first and second side surfaces,
wherein the third passivation layer extends perpendicular to the first passivation layer and extends to the full depth of the first passivation layer, and
wherein the first passivation layer and the third passivation layer comprise different materials.

2. The piezo stack of claim 1, comprising a second passivation layer applied on the second side surface opposite the first side surface,
wherein the second passivation layer has a rectangular cross section defining a pair of opposing ends that are flush with the opposing third and fourth side surfaces of the piezo stack.

3. The piezo stack of claim 2, wherein at least one of the first and second passivation layers comprises plastic.

4. The piezo stack of claim 3, wherein the plastic comprises a polyimide.

5. A method for the passivation of at least one side surface of a piezo stack, the method comprising:
providing a piezo block including opposing first and second side surfaces having a block length in a first direction, applying a first passivation layer on the first side surface of the piezo block,
curing the first passivation layer,
mechanically separating the piezo block to define at least one piezo stack having a stack length in the first direction that is less than the block length.

6. The method of claim 5, further comprising applying a second passivation layer on the second side surface of the piezo block before the mechanical separation of the piezo block.

7. The method of claim 6, wherein at least one of the first and second passivation layer is applied by a dispensing, template printing, or screen printing process.

8. The method of claim 6, comprising curing the second passivation layer before the mechanical separation of the piezo block.

9. The method of claim 5, wherein the mechanical separation of the piezo block is performed along one or more separating axes extending perpendicular to the first and second side surfaces.

10. The method of claim 5, further comprising:
for one or more of the at least one piezo stack formed by the mechanical separation:
applying a third fourth passivation layer on a third side surface of the respective piezo stack, the third side surface extending perpendicular to the first and second surfaces,
wherein the third passivation layer extends perpendicular to the first passivation layer of the respective piezo stack and extends beyond the first and second edges of the third side surface in a direction perpendicular to the first passivation layer.

* * * * *